United States Patent [19]

Furrer

[11] Patent Number: 4,646,359

[45] Date of Patent: Feb. 24, 1987

[54] METHOD AND APPARATUS FOR CONTROLLING THE CARRIER OF AN AMPLITUDE-MODULATED TRANSMITTER

[75] Inventor: Andreas Furrer, Mönthal, Switzerland

[73] Assignee: BBC Brown, Boveri & Company Limited, Baden, Switzerland

[21] Appl. No.: 727,430

[22] Filed: Apr. 26, 1985

[30] Foreign Application Priority Data

May 10, 1984 [CH] Switzerland ............... 2303/84

[51] Int. Cl.[4] ........................ H03F 3/38; H04B 1/03
[52] U.S. Cl. ........................ 455/108; 330/10; 455/116
[58] Field of Search ............ 455/91, 108, 116, 127; 330/10, 207 A; 332/9 R; 307/107, 151

[56] References Cited

U.S. PATENT DOCUMENTS

| | | | |
|---|---|---|---|
| 3,229,209 | 1/1966 | Critchlow et al. | 455/109 |
| 4,186,346 | 1/1980 | Wysocki | 455/116 |
| 4,403,197 | 9/1983 | Swanson | 330/10 |
| 4,417,358 | 11/1983 | Zeis | 455/116 |
| 4,449,103 | 5/1984 | Kyrian | 455/108 |
| 4,524,335 | 6/1985 | Yokoyama | 330/10 |
| 4,560,944 | 12/1985 | Furrer | 330/10 |

Primary Examiner—Benedict V. Safourek
Attorney, Agent, or Firm—Oblon, Fisher, Spivak, McClelland & Maier

[57] ABSTRACT

A method for controlling the carrier of an amplitude-modulated transmitter, wherein a saving in carrier power with simultaneous minimum dynamic distortions is achieved by digitizing the useful signal and digitally processing all control signals. The circuit for carrying out the method contains a digital computing circuit which calculates from the digital amplitude values of the useful signal a carrier-control value which controls the carrier level via a digital switching amplifier.

8 Claims, 9 Drawing Figures

METHOD AND APPARATUS FOR CONTROLLING THE CARRIER OF AN AMPLITUDE-MODULATED TRANSMITTER

BACKGROUND OF THE INVENTION

1. Field of the Invention

The present invention relates to a method for controlling the carrier of an amplitude-modulated transmitter. Such a method is known from Swiss patent No. 634 183.

2. Discussion of Background

In the known method, the useful Low-frequency signal present at the input of the transmitter and to be transmitted via the transmitter is converted, on the one hand, into a sequence of pulse-duration-modulated pulses which are used to drive a switching amplifier to conduct and not to conduct. On the other hand, a part of the incoming useful signal is branched off and rectified. The audible alternating currents are then filtered out in a filter chain. Following the filter chain, a slowly variable direct voltage remains which corresponds to the variation of the dynamic range of the useful signal. This slowly variable direct voltage is superimposed on the useful signal before it is converted into pulse-duration-modulated pulses.

During the subsequent pulse-duration-modulation process, functioning in accordance with the familiar saw tooth method, the superimposition of the slowly variable direct voltage leads to a dynamic-range-dependent displacement of the operating point which becomes noticeable a dynamic-range-dependent direct-voltage component at the output of the switching amplifier. During the subsequent modulation of the carrier oscillation, this direct-voltage component in turn influences the operating point on the modulation characteristic resulting in a direct dynamic-range-dependent control of the carrier.

The described method of carrier control according to the prior art is based on generating an analogous dynamic-range-dependent direct voltage by rectification and subsequent filtering of the useful signal. It is especially this filtering, that is to say the time-averaging over the variable amplitude of the useful signal which results in serious restrictions for the rapidity of response of the carrier control system with pulse-shaped changes of this amplitude of the useful signal (so called "tone bursts"). The carrier amplitude can follow such pulse-shaped changes only within the modest framework predetermined by the large time constant of the filter chain.

This inertia of the familiar carrier control system leads to not negligible distortions in the transmission to the useful signal to the receiver, producing a clear loss in transmission quality.

SUMMARY OF THE INVENTION

Accordingly, the objects of this invention are to provide a novel method for controlling the carrier of an amplitude-modulated transmitter which makes it possible to achieve a largely undelayed adaptation of the carrier amplitude even with rapid changes of the amplitude of the useful signal and which thus achieves an improvement in transmission quality.

These and other objects are achieved according to the invention by providing a novel method for controlling the carrier of an amplitude-modulated transmitter, wherein a control signal dependent on the dynamic range of a useful low-frequency signal is derived from the useful low-frequency signal and is amplified by means of a switching amplifier and used for modulating a transmitter output stage, and the mean carrier amplitude of the transmitter is controlled by the dynamic-range-dependent control signal. According to the method of the invention, the amplitude of the useful signal is periodically sampled and converted into digital amplitude values. For each of the digital amplitude values a digital carrier-control value is calculated as determined by a carrier-control characteristic and is added to the respective digital amplitude value. The resultant sum is amplified as a dynamic-range-dependent digital control-signal value by means of a digital switching amplifier.

The completely digitized carrier control system according to the invention, which also includes the amplification of the dynamic-range-dependent digital control-signal signal value in a digital switching amplifier, is characterised by a minimum circuit-dependent delay in the generation of the digital carrier-control value which is of the order of magnitude of the cycle time occurring in the analog-digital conversion and the calculation of the carrier-control value and is typically in the microsecond range.

Special advantages are produced by the digital signal processing in the carrier-control method according to the invention with regard to adaptability to various requirements occurring in transmission operation. The carrier-control characteristic forming the basis for the calculation of the carrier-control value can be changed in a simple manner by suitable programming steps and can thus be adapted rapidly and optimally, in the sense of energy saving, to the respective mode of transmission operation. In addition, other parameters of carrier control, such as, for example, a delayed reduction in carrier amplitude during program intermissions can also be influenced at programming level without changing the circuit configuration of the carrier control system.

In the preferred illustrative embodiment according to the invention, a digital carrier-characteristic value is allocated to each of the digital amplitude values in accordance with the determination of the carrier-control characteristic. The carrier control value is determined from the difference between a fixed, digital carrier value and a dynamic-range-dependent digital carrier-reduction value. The carrier-characteristic value is compared with a digital memory content and is used as a new memory content and as carrier-reduction value when the carrier-characteristic value is smaller than the respective memory content. The memory content is kept constant for a fixed delay time, is incremented step by step after the delay time has elapsed, and is used as the carrier-reduction value when the carrier-characteristic value is greater than the respective memory content. storage of the carrier-reduction values, the comparison between carrier characteristic value and memory contents and the special modification of the memory contents as a function of the result of the the comparison result in a specially advantageous time characteristic of the carrier control system. In Particular, with a pulse-shaped rise in amplitude of the useful signal, the carrier amplitude is driven upwards almost without delay in accordance with the carrier control characteristic whilst with a longer-duration drop in amplitude of the useful signal, the carrier level is initially kept constant at the higher level for a fixed delay time and is dropped step by step only after the delay time has elapsed, provided a new raising of the level does not become necessary due to an intermediate tone burst.

This different behavior in time with a rise and a fall in the amplitude of the useful signal combines in a particularly favorable manner high savings in carrier power with very low distortion in dynamic range during the transmission of the useful signal.

Essentially, a circuit for carrying out the carrier-control method according to the invention contains between the analog digital converter at the input and the digital switching amplifier at the output a subtraction circuit which subtracts from an input value corresponding to a constant carrier level a dynamic-range-dependent digital value calculated in the digial-computing circuit and provides at the output a dynamic-range-dependent digital controlsignal value for driving the switching amplifier.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3a shows the variation with time of an illustrative digitised amplitude of the useful signal, including a superimposed carrier value;

FIG. 3b shows the variation with time of the digital amplitude value corresponding to the absolute amount;

FIG. 3c shows two possible carrier-control characteristics

FIG. 3d shows the variation with time of the carrier-characteristic value resulting from FIG. 3b and c;

FIG. 3e shows the variation with time of the memory contents associated with FIG. 3d;

FIG. 3f shows the variation with time of the carrier-reduction value resulting from FIG. 3e; and FIG. 3g shows the variation with time of the carrier-control value resulting overall.

DESCRIPTION OF THE PREFERRED EMBODIMENTS

Figure 1:
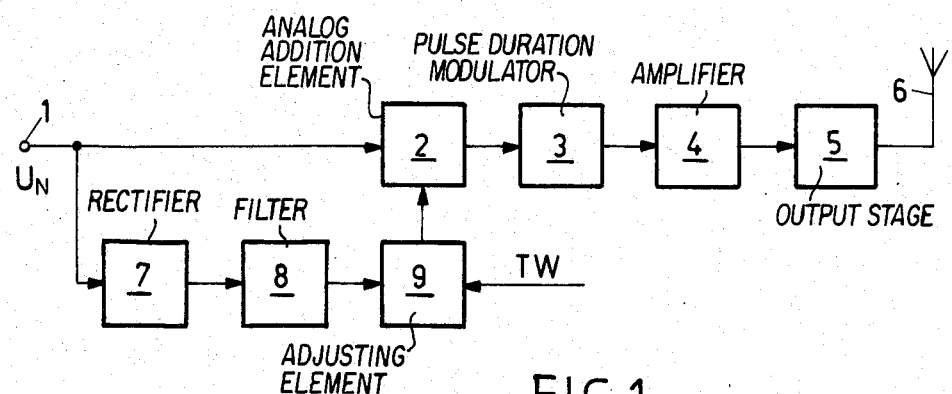
FIG. 1 is a block diagram of an analog carrier-control system according to the prior art.

Referring now to the drawings, wherein like reference numerals designate identical or corresponding parts throughout the several views, and more particularly to FIG. 1 thereof, the simplified block diagram of a transmitter comprising a carrier-control system according to the prior art (Swiss patent No. 634 183) is shown. A lowfrequency useful signal $U_N$, in general the transmitter program signal, is present at an input terminal 1. The useful signal $U_N$ is fed directly to one input of an analog adder 2. A part of the useful signal $U_N$ is branched off behind the input terminal 1, rectified in a rectifier 7, stripped of audible frequency in a subsequent filter chain 8 and fed to the other input of the adder 2 via an adjusting circuit 9. In the addition element 2, both input signals, the useful signal $U_N$ and the dynamic-range-dependent, slowly variable direct voltage from the adjusting circuit 9, are superimposed and the resulting analog sum signal is fed to the input of a pulse-duration modulator 3 which, by comparison with a sawtooth voltage supplied externally, converts the sum signal into pulse-duration-modulated pulses.

The pulse-duration-modulated pulses switch a pulse-duration-modulated switching amplifier 4 on and off so that pulse-duration-modulated high-voltage pulses are available at the output of the switching amplifier, which pulses, after preceding low-pass filtering, are fed for modulation purposes to a transmitter output stage 5 and from there to an antenna 6.

At the input of the transmitter output stage 5, a direct-voltage component is produced as a function of th duration of the high-voltage pulses and determines the operating point on the modulation characteristic. The addition of the dynamic-range-dependent direct voltage and, if necessary, a fixed carrier value TW to the useful signal $U_N$ affects the duration of the high-voltage pulses in dependence on the dynamic range which also changes the carrier level via the operating point of the modulation characteristic.

The filter chain 8, which filters out all audible frequencies, that is to say all frequencies above about 20 Hz, from the rectified useful signal, loads the carrier-control system with a time constant on the order of magnitude of 50 msec. This time constant causes a delay in the change in carrier level both with a sudden rise and with a sudden drop in amplitude of the useful signal. Whilst in the second case, this delay only results in a reduced saving in carrier power, the delay in the first case leads to dynamic distortions during transmission since sudden peaks in the amplitude of the useful signal are cut off and, therefore, are not also transmitted.

Figure 2:
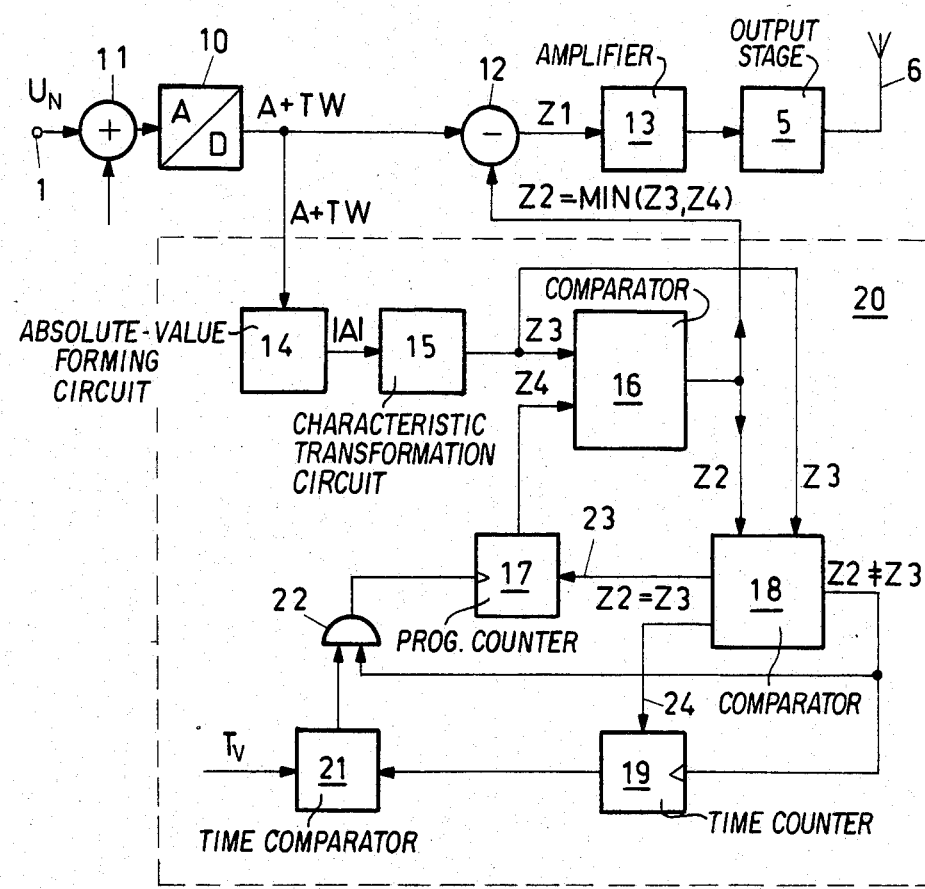
FIG. 2 is a block diagram of a circuit for carrying out the carrier-control method according to the invention.

A fundamentally different behavior is produced by a circuit for carrying out the carrier-control method according to the invention as reproduced as preferred illustrative embodiment in the block diagram of FIG. 2. In this circuit, input terminal 1, transmitter output stage 5 and antenna 6 have the same meaning and function as in the known circuit arrangement of FIG. 1.

However, differences are already produced in the type and operation of the switching amplifier used. Whilst it is true that the pulse-duration-modulated switching amplifier 4 from FIG. 1 is switched on and off but must still be considered as an analog amplifier because of the continuously varying pulse duration, a digital switching amplifier 13 as known in itself from German Auslegeschrift No. 30 44 956 is used in the circuit according to FIG. 2.

Such a digital switching amplifier preferably comprises a plurality of identically configured switching stages which, in the switched-on condition, in each case deliver the same constant output voltage and of which in each case such a number is switched on that the sum of the output voltages of the switching stages switched on corresponds to the input quantity amplified by a factor.

A digital switching amplifier of the type described is advantageously driven by a digital input quantity and is therefore particularly suitable for carrying out the method according to the invention in which the signal processing is carried out completely in digital form.

In the circuit of FIG. 2, the useful signal $U_N$ first passes from the input terminal 1 to the input of an analog/digital converter 10 where it is sampled with a sampling rate of, for example, 100 kHz, which is far above the range of useful frequencies, and is converted into a sequence of digital amplitude values A. The digital amplitude values A are then processed among other things in a digital computing circuit 20 which calculates for each amplitude value a suitable carrier-reduction value Z2 and passes this value to the second input of a subtraction circuit 12 which is arranged between the analog-digital converter 10 and the digital switching amplifier 13.

The first input of the subtraction circuit 12 is in each case fed with a digital value (A+TW) which results from the addition of the digital amplitude value A and a fixed carrier value TW. The externally presettable carrier value TW is the digital number which unchangeably fixes the carrier level if carrier control is lacking, that is to say in the absence of a dynamic-range-dependent carrier reduction value Z2.

The carrier value TW is preferably generated by applying the useful signal $U_N$, which is varying around the mean zero, to the (+) and (−) inputs, not shown in FIG. 2, of the analog/digital converter 10. The digital values delivered at the output of the analog/digital converter 10 will then vary around the centre of the range of output numbers representing the carrier value TW.

In order to be able to change the carrier value TW, an addition circuit 11 can be additionally provided in front of the input of the analog/digital converter 10, which addition circuit displaces the mean value of $U_N$, and thus also the carrier value TW, at the output of the digital/analog converter 10 by adding a direct voltage to the signal $U_N$.

Subtraction of the carrier reduction value Z2 from the carrier value TW in the subtraction circuit 12 provides a digital carrier control value TSW (=TW−Z2) which is determining for carrier control and which, together with the digital amplitude value A, forms a control signal value Z1 (Z1=A+TSW=A+TW−Z2) which is used for driving the digital switching amplifier 13.

Figure 3A:
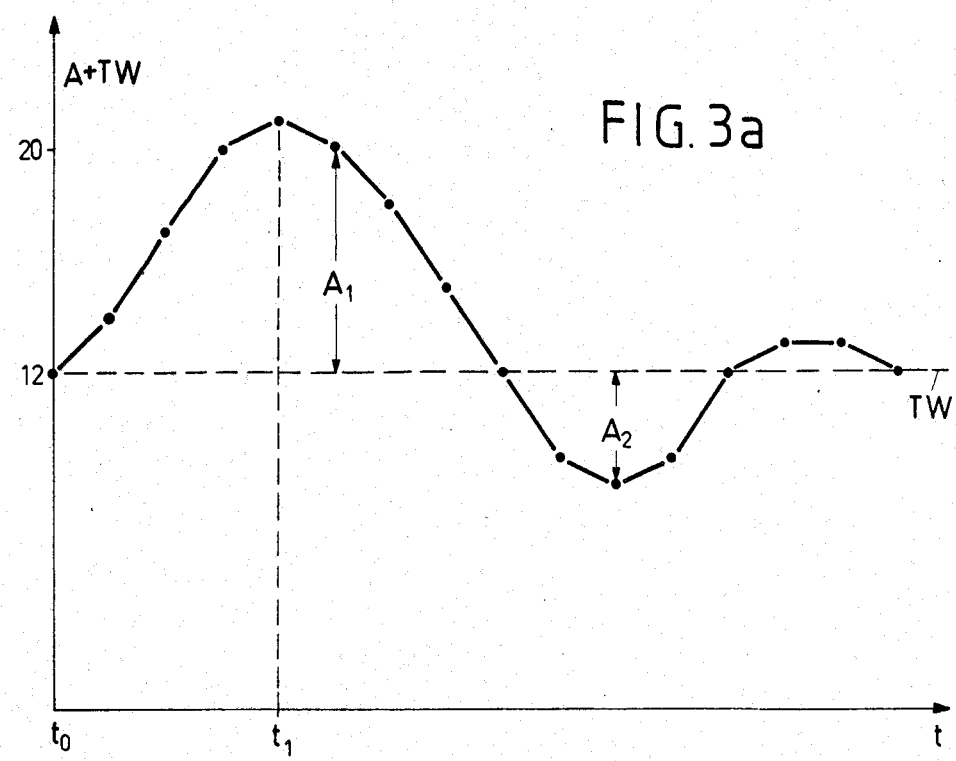
FIGS. 3a-3g are timing diagrams of the digital quantities occurring in a circuit arrangement according to FIG. 2, wherein in particular.

The variation in time of the digital amplitude values A is shown together with a fixed carrier value TW in FIG. 3a for an illustrative useful signal $U_N$. In this illustration, the arbitrarily chosen carrier value TW corresponds to the number 12, the digital amplitude values A varying about the carrier value TW in the positive and negative direction are reproduced in the form of discretetime points whilst the continuous curve corresponds to the useful analog signal $U_N$ at the input of the analog/digital converter 10.

The useful-signal curve drawn in FIG. 3a reaches a maximum at time $t_1$. Referred to the carrier value TW, both positive and negative amplitude values generally occur of which in each case one, $A_1$ and $A_2$, have been picked out. Since the carrier level of the transmitter must be raised similarly with positive and negative amplitudes of the useful signal $U_N$ to such an extent that a cutting-off of the amplitude peaks is avoided, it is only the absolute value of the useful-signal amplitude which is of significance for the carrier-control system. According to FIG. 3b, therefore, all digital amplitude values A are converted from the digital values (A+TW) into absolute values /A/ corresponding to the absolute value of the amplitude of the useful signal.

In this conversion, the positive amplitude value $A_1$ is identical to the associated absolute value $/A_1/$ but the negative amplitude value $A_2$ is transformed into a different absolute value $/A_2/$. In the digital computing circuit 20 from FIG. 2, the conversion described is achieved by an absolute-value forming circuit 14 which preferably contains one or more read-only memories, for example of the EPROM type 2732 which are addressed by the digital values (A+TW) and contain the associated absolute value /A/ stored under the respective address. Conversion of the amplitude values by reading out the absolute values stored in the read-only memory takes place within periods of less than 500 ns, thus permitting an extremely rapid transformation to be carried out.

In the digital computing circuit 20, the absolute values /A/ delivered by the absolute-value forming circuit 14 are fed to the input of a characteristic-transformation circuit 15 which allocates to each incoming absolute value /A/ a digital carrier-characteristic value Z3 as determined by a carrier-control characteristic TK. FIG. 3c shows two preferred types a and b of the carrier-control characteristic.

The carrier-control characteristic a is designed in such a manner that large absolute values /A/ are allocated small carrier-characteristic values Z3 and conversely. According to the example, the carrier-characteristic value Z3=0 appears at the output of the characteristic-transformation circuit 15 when the absolute value /A/=12 is present at the input and the carrier-characteristic value Z3=12 when the absolute value at the input has the value 0.

In comparison, a modified form b of the carrier-control characteristic TK is characterised by the fact that mean absolute values /A/ are allocated a constant carrier-characteristic value Z3 (the value 7 in the example of FIG. 3c) whilst with small absolute values /A/, the carrier-characteristic value Z3 decreases in the same direction as the absolute value /A/.

Figure 3B:
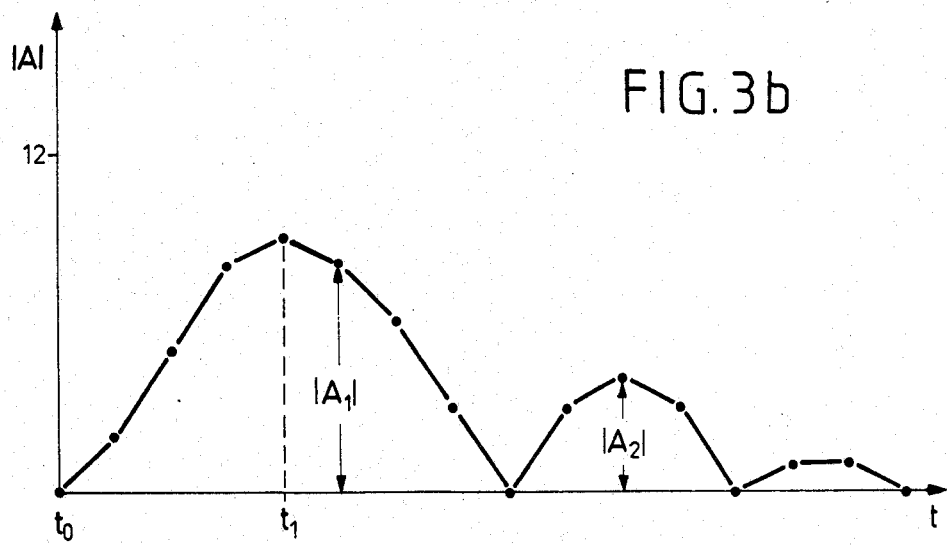
Figure 3C:
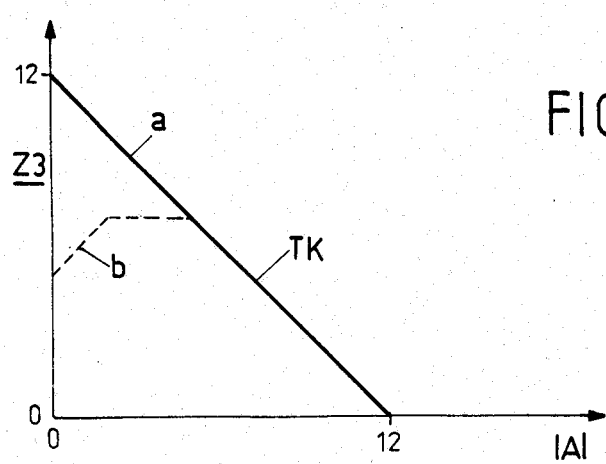
Figure 3D:
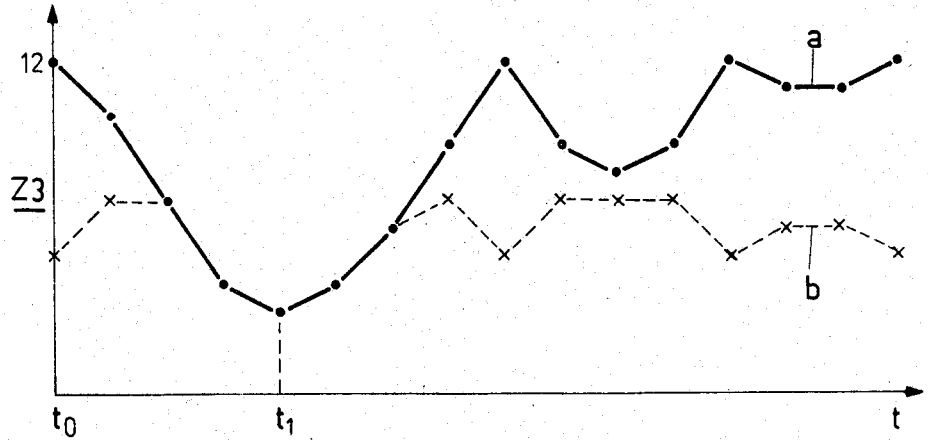

According to types a and b of the carrier-control characteristic TK according to FIG. 3c, two different variations of the associated carrier-characteristic value Z3, which are reproduced in FIG. 3d, are produced for the illustrative variation with time of the absolute value /A/ from FIG. 3b.

Like the absolute-value forming circuit 14, the characteristic-transformation circuit 15, too, is preferably constructed with programmable read-only memories of the type mentioned in which the various carrier-characteristic values Z3 are stored and are addressed by means of the absolute values /A/. The resultant carrier-characteristic values Z3 pass from the characteristic-transformation circuit 15 to one input each of a first comparator 16 and of a second comparator 18. The first comparator 16 compares the carrier-characteristic value Z3 present at one input with a digital memory content Z4 which is applied to the other input from a programmable counter 17 and corresponds to the respective count of the programmable counter 17.

The comparison in the first comparator 16 determines which of the two input values Z3 and Z4 is smaller. This smaller value MIN (Z2, Z3) is then subtracted in the subtraction circuit 12 from the sum of the digital amplitude value A and the fixed carrier value TW as the digital carrier reduction value Z2 and is simultaneously passed to the other input of the second comparator 18 where it is compared with the carrier-characteristic value Z3.

The comparison of the values Z2 and Z3 in the second comparator 18 can lead to two different results: if Z2=Z3, this digital value is passed via a first output to a programming input 23 of the programmable counter 17 and is there accepted as the new count. Simultaneously, a reset pulse is delivered via a second output of the second comparator 18 to a reset input 24 of a time counter 19 which resets this time counter to 0.

If, in contrast, $Z2 \neq Z3$, a counting pulse appears at a third output of the second comparator 18, which pulse is passed to a counting input (clock input) of the time counter 19 and increments its count by one. The count of the time counter 19 is a digital measure of the elapsed part of a delay time $T_V$ which, externally presettable, determines the time behavior of the carrier level with a decaying amplitude of the useful signal and is preferably greater than 20 ms.

The count of the time counter 19 is compared in a time comparator 21 with the delay time $T_V$ pre-determined as digital value. If the two are identical, that is to say if the delay time $T_V$ has elapsed, the output of the time comparator 21 jumps from a logical "0" to a logical "1" so that a subsequent AND gate 22 can freely pass the counting pulses appearing at the third output of the second comparator 18 to a counting input (clock input) of the programmable counter 17. This causes the count of this counter to be incremented, after the delay time $T_V$ has elapsed, step by step at the clock rate of the digital computing circuit 20 for as long as the comparison in the second comparator 18 supplies the result $Z2 \neq Z3$, that is to say for as long as the memory content Z4 is smaller than the respective carrier-characteristic value Z3.

However, as soon as the step-by-step incrementing of the memory content Z4 or a drop in the carrier-characteristic value Z3 causes this carrier-characteristic value to become smaller than the memory content, Z3 appears as carrier-reduction value Z2 at the output of the first comparator 16, the second comparator, therefore supplies the result $Z2 = Z3$, the count of the programmable counter 17 is set to Z2 via the programming input 23 and the time counter 19 is reset so that a new delay cycle can begin.

The loop formed from the comparators 16 and 18 and the programmable counter 17 as temporary memory provides a memory content Z4 in such a manner that, if the carrier-characteristic values Z3 fall, that is to say if the digital amplitude values A rise, Z4, delayed by one clock interval, also falls but that, if the carrier-characteristic values Z3 rise, that is to say if the digital amplitude values A drop, Z4 is initially held constant at a low level via the delay time $T_V$ and is incremented step by step only after $T_V$ has elapsed.

Figure 3E:
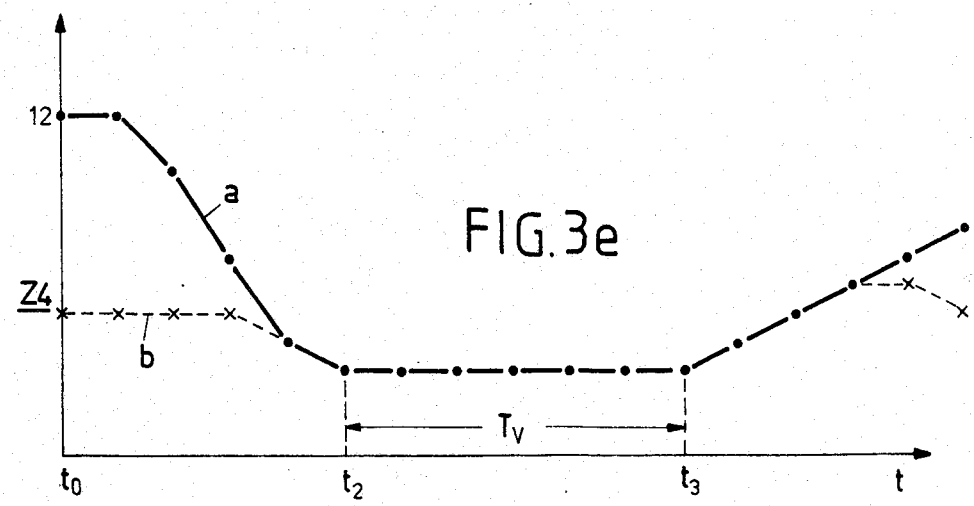

This situation is clarified by FIG. 3e in which the behavior in time of the memory content Z4, resulting for the carrier-characteristic values Z3 from FIG. 3d, is shown. Here, too, different sequences of values occur for different carrier-control characteristics a and b which are characterised by the corresponding letters a and b.

Figure 3F:
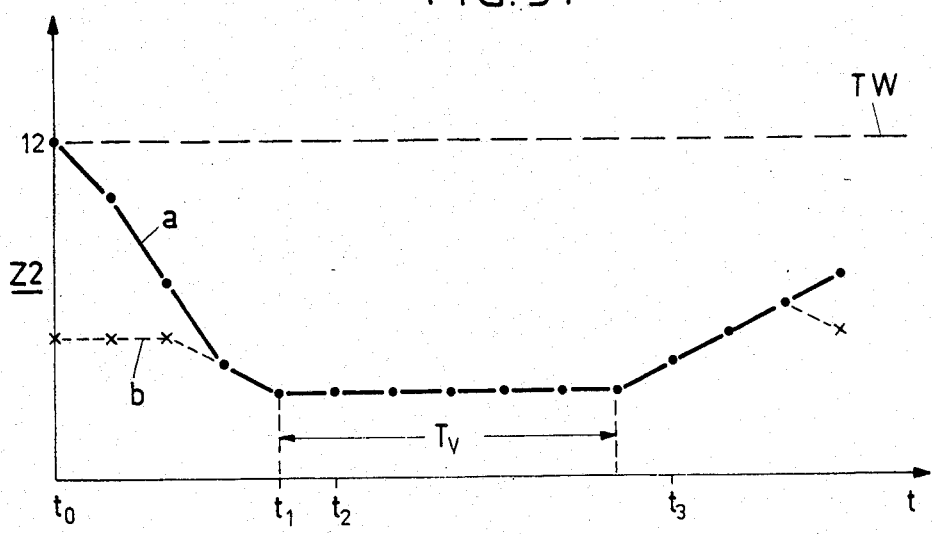

Comparison in the first comparator 16 produces from the sequences of values of FIG. 3d and 3e (carrier-characteristic value Z3 and memory content Z4, respectively) the value sequences of FIG. 3f for the carrier-reduction value Z2, a small carrier-reduction value Z2 corresponding to a high carrier level and a large carrier-reduction value Z2, in contrast, corresponding to a greatly reduced carrier level. Thus, according to the carrier-control characteristic a from FIG. 3c, for a digital amplitude value $A = 0$ as it occurs in FIG. 3a at time $t_0$, the associated carrier-reduction value Z2 is maximum, in the special example of FIG. 3a–3g even equal to the fixed carrier value TW, resulting after subtraction in the subtraction circuit 12 in a control-signal value $Z1 = 0$ which corresponds to a disappearing carrier level.

As the digital amplitude value A rises between times $t_0$ and $t_1$, the carrier-reduction value Z2 drops and remains constant at the low level from $t_1$ for the delay period $T_V$ since all subsequent amplitude values are smaller than the maximum value occurring at time $t_1$, and only rises again step by step after $T_V$ has elapsed.

Figure 3G:
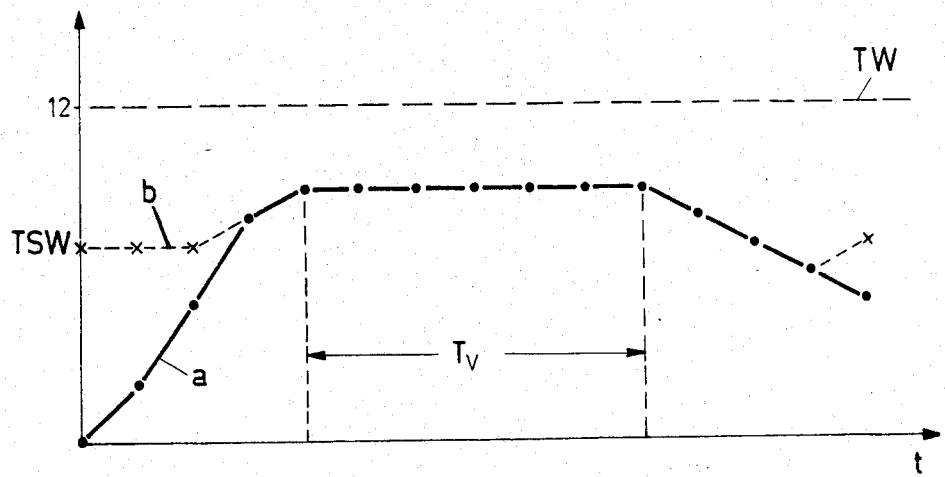

The carrier-control value TSW resulting as the difference between the carrier value TW and Z2 and reproduced in FIG. 3g behaves as the exact mirror image of the carrier-reduction value Z2. The behavior with time of the carrier-control value TSW is analogous to the behavior with time of the carrier level.

All parts of the digital computing circuit 20 are preferably constructed of standard logic components. For the comparators 16 and 18 as for the time comparator 21, individual or series-connected SN 5485 or SN 7485-type 4-bit comparators are used. The digital values at the output of the first comparator 16 and at the first output of the second comparator 18 are output via SN 54174-type sextuple D-type flip-flops in which the input values Z3 and Z4, and Z2 or Z3, depending on the result of the comparison, present at the D inputs are transferred by a clock pulse to the Q outputs which are connected to the designated outputs of the comparators.

As programmable counter 17 and time counter 19, SN 54193 or SN 54163-type synchronous 4-bit counters are preferably used and employed either singly or in cascase depending on the bit number of a digital value.

Overall, the carrier-control system according to the invention represents a highly flexible control method which combines great saving in carrier power with a minimum of dynamic distortions.

Obviously, numerous modifications and variations of the present invention are possible in light of the above teachings. It is therefore to be understood that within the scope of the appended claims, the invention may be practiced otherwise than as specifically described wherein.

What is claimed as new and desired to be secured by Letters Patent of the United States is:

1. A method for controlling the carrier of an amplitude-modulated transmitter, herein a control signal dependent on the dynamic range of a useful low-frequency signal is derived from the useful low-frequency signal and is amplified by means of a switching amplifier and used for modulating a transmitter output stage, the mean carrier amplitude of the transmitter being controlled by a dynamic-range-dependent control signal, comprising:

periodically sampling the amplitude of the useful signal and converting the sampled signal into digital amplitude values;

allocating each of the digital amplitude values a digital carrier-control value determined by a fixed carrier-control characteristic with a certain slope and adding said digital carrier-control value to the respective digital amplitude value to produce a sum; and amplifying said sum as a dynamic-range-dependent digital control-signal value by means of a digital switching amplifier;

allocating a digital carrier-characteristic value to each of the digital amplitude values in accordance with the determination of the predetermined carrier-control characteristic;

determining the carrier control value as the difference between a fixed, digital carrier value and a dynamic-range-dependent digital carrier-reduction value;

comparing the carrier-characteristic value with a digital memory content;

using the carrier-characteristic value as a new memory content and as carrier-reduction value when the carrier-characteristic value is smaller than the respective memory content; and maintaining the memory content constant for a fixed delay time, incrementing the memory content step by step after the delay time has elapsed, and using the memory content as the carrier-reduction value when the carrier-characteristic value is a greater than the respective memory content.

2. A method according to claim 1 wherein only digital amplitude values corresponding to the absolute value of the amplitude of the useful signal are used for calculating the carrier-control value.

3. A method according to claim 1, wherein said step of allocating the carrier-characteristic value to the digital amplitude value comprises using a carrier-control characteristic with said slope being negative in an upper range of said amplitude values.

4. A method according to claim 3, wherein the used carrier-control characteristic extends horizontally for mean amplitude values with said slope being positive for small amplitude values.

5. A method according to claim 1, comprising: selecting the delay time to be greater than 20 ms.

6. A circuit for carrying out a method for controlling the carrier of an amplitude-modulated transmitter, wherein a control signal dependent on the dynamic range of a useful low-frequency signal is derived from the useful low-frequency signal and is amplified by means of a switching amplifier and used for modulating a transmitter output stage, the mean carrier amplitude of the transmitter being controlled by a dynamic-range-dependent control signal, wherein said method includes the steps of periodically sampling the amplitude of the useful signal and converting the sampled signal into digital amplitude values, allocating each of the digital amplitude values a digital carrier-control value determined by a fixed carrier-control characteristic and adding said digital carrier-control value to the respective digital amplitude value to produce a sum, and amplifying the sum as a dynamic-range-dependent digital control-signal value by means of a digital switching amplifier, comprising:

an input terminal for the useful signal;

an analog/digital converter which is connected to the input terminal;

a digital switching amplifier and a transmitter output stage which is connected to the output of the digital switching amplifier;

a subtraction circuit disposed between an output of the analog/digital converter and an input of the digital switching amplifier; and a digital computing circuit for calculating the digital control-signal value;

wherein a first input of the subtraction circuit and an input of the digital computing circuit are connected to the output of the analog/digital converter, a second input of the subtraction circuit is connected to an output of the digital computing circuit, and an output of the subtraction circuit is connected to an input of the digital switching amplifier;

wherein the digital computing circuit comprises a characteristic-transformation circuit, a first comparator, a programmable counter, a second comparator, a time counter, a time comparator and an AND gate, wherein:

an input of the characteristic-transformation circuit is connected to an output of the analog/digital converter and the carrier-characteristic-transformation circuit is passed to one input each of the first and of the second comparators;

an output of the programmable counter is connected to another input of the first comparator;

the carrier-reduction value is present at the output of the first comparator and is passed to a second input of the subtraction circuit and to another input of the second comparator;

a first output of the second comparator supplies, with equality of the inputs thereto, an input value to a programming input of the programmable counter, a second output of the second comparator supplies, with equality of the inputs thereto, a reset pulse to a reset input of the time counter, and a third output of the second comparator supplies, with inequality of the inputs thereto, a counting pulse to a counting input of the time counter and, via an input of the AND gate, to a counting input of the programmable counter; and the time comparator compares the count of the time counter with the preset delay time and with equality of the inputs thereto sets a second input of the AND gate to a predetermined logic level.

7. A circuit according to claim 6, comprising:

an addition circuit disposed in front of the analog/digital converter for adding a constant direct voltage to the useful signal, the digital computing circuit including means for calculating a digital-carrier reduction value which is subtracted from the carrier value and results in production of the carrier-control value.

8. A circuit according to claim 6, wherein the characteristic-transformation circuit comprises a programmable read-only memory which is addressed by the digital amplitude values and contains associated carrier-characteristic values as memory contents.

* * * * *